(12) United States Patent
Akahane

(10) Patent No.: US 9,525,414 B2
(45) Date of Patent: Dec. 20, 2016

(54) GATE DRIVE CIRCUIT PROVIDING CONSTANT DRIVING CURRENT

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/942,744

(22) Filed: Nov. 16, 2015

(65) Prior Publication Data

US 2016/0072503 A1 Mar. 10, 2016

Related U.S. Application Data

(63) Continuation of application No. PCT/JP2014/063921, filed on May 27, 2014.

(30) Foreign Application Priority Data

Jun. 14, 2013 (JP) .................................. 2013-125173

(51) Int. Cl.
*H03K 3/00* (2006.01)
*H03K 17/687* (2006.01)
*H03K 17/14* (2006.01)
*H03K 17/16* (2006.01)

(52) U.S. Cl.
CPC ........ *H03K 17/6872* (2013.01); *H03K 17/145* (2013.01); *H03K 17/163* (2013.01); *H03K 2217/0063* (2013.01)

(58) Field of Classification Search
CPC H03K 17/6872; H03K 17/145; H03K 17/163; H03K 2217/0063
See application file for complete search history.

(56) References Cited

U.S. PATENT DOCUMENTS

| 4,833,350 | A | * | 5/1989 | Frisch | H03K 19/09448 326/64 |
| 5,440,258 | A | * | 8/1995 | Galbi | H03K 19/00384 327/112 |
| 5,543,994 | A | | 8/1996 | Wilhelm et al. | |
| 6,147,550 | A | * | 11/2000 | Holloway | G05F 3/205 327/538 |
| 6,166,570 | A | * | 12/2000 | Hedberg | H04L 25/0276 326/26 |

(Continued)

FOREIGN PATENT DOCUMENTS

| JP | H06-216735 A | 8/1994 |
| JP | 2886495 B2 | 4/1999 |

(Continued)

*Primary Examiner* — Kenneth B Wells
(74) *Attorney, Agent, or Firm* — Rabin & Berdo, P.C.

(57) ABSTRACT

A gate drive circuit may include an output transistor that supplies a constant current to a gate of a switching element and drives the switching element on. A pre-driver may have a CMOS configuration including a p-channel MOS-FET and n-channel MOS-FET. The pre-driver may receive a gate control signal that drives the output transistor on/off. A reference current source may controls the gate voltage of a constant current transistor and provide a constant current from the constant current transistor A buffer amplifier may apply the gate voltage of the constant current transistor as the operating reference voltage of the pre-driver.

16 Claims, 7 Drawing Sheets

(56) References Cited

U.S. PATENT DOCUMENTS

| | | | |
|---|---|---|---|
| 6,496,056 B1 * | 12/2002 | Shoji | H03K 3/011 |
| | | | 327/538 |
| 8,035,662 B2 * | 10/2011 | Yajima | G09G 3/2096 |
| | | | 345/206 |
| 2003/0012040 A1 | 1/2003 | Orita et al. | |
| 2005/0077948 A1 | 4/2005 | Kojima | |
| 2008/0094111 A1 | 4/2008 | Nakamori et al. | |
| 2011/0031918 A1 | 2/2011 | Sugie | |

FOREIGN PATENT DOCUMENTS

| | | | |
|---|---|---|---|
| JP | 2003-032102 A | 1/2003 |
| JP | 2003-338744 A | 11/2003 |
| JP | 2005-123666 A | 5/2005 |
| JP | 2005-184656 A | 7/2005 |
| JP | 2008-103895 A | 5/2008 |
| JP | 2010-193431 A | 9/2010 |

* cited by examiner

GATE DRIVE CIRCUIT PROVIDING CONSTANT DRIVING CURRENT

CROSS-REFERENCE TO RELATED APPLICATION

This application is a continuation of International Application PCT/JP2014/063921 filed on May 27, 2014, and claims priority to Japanese Patent Application No. 2013-125173, filed on Jun. 14, 2013, the contents of which are entirely incorporated herein by reference for all purposes.

BACKGROUND

1. Technical Field

The present disclosure relates to a gate drive circuit where the output current of an output transistor, which drives a switching element on/off, can be kept constant despite temperature or supply voltage fluctuations.

2. Description of Related Art

A gate drive circuit which drives a switching element on/off, such as an insulated gate bipolar transistor (IGBT) or metal-oxide-semiconductor field-effect-transistor (MOS-FET), in a power converter is configured in such a way as in, for example, FIG. 6. In FIGS. 6, Q1 and Q2 are switching elements, each formed of a MOS-FET forming a half-bridge circuit, and gate drive circuit 1 drives the high-side switching element Q1 on/off. A gate drive circuit 2 which drives the low-side switching element Q2 on/off is also configured in the same way as the gate drive circuit 1. Consequently, herein, a description will be given of the gate drive circuit 1, which drives the high-side switching element Q1.

The gate drive circuit 1 includes an output transistor PM2, formed of a p-channel MOS-FET, which supplies a constant current to the gate of the switching element Q1 and drives the switching element Q1 on/off. Furthermore, the gate drive circuit 1 includes an output transistor NM2, formed of an n-channel MOS-FET connected in totem-pole fashion to the output transistor PM2, which is controlled on/off in a complementary relationship with the output transistor PM2.

Also, the gate drive circuit 1 includes a transistor PM1, formed of a p-channel MOS-FET, which configures a current mirror circuit with the output transistor PM2. Furthermore, the gate drive circuit 1 includes a control transistor NM1, formed of an n-channel MOS-FET. A current Icont, of which, is controlled by the output of an error amplifier AMP with the transistor PM1 as a load. Incidentally, the error amplifier AMP assumes the role of making the current Icont constant in response to a voltage difference between a voltage, at resistor R1 in response to the current Icont flowing through the control transistor NM1, and a reference voltage Vref.

Also, a transistor NM3, which is formed of an n-channel MOS-FET and is driven on/off in response to a gate control signal nDRV, controls the on/off drive of the control transistor NM1 by the output of the error amplifier AMP. When control transistor NM1 turns on, the current Icont flowing through the control transistor NM1 flows via the transistor PM1. As a result, a current proportional to the current Icont flows through the output transistor PM2 configuring the current mirror circuit with the transistor PM1. The current is supplied to the gate of the switching element Q1, and the switching element Q1 is driven on.

That is, the gate drive circuit 1 of the described configuration, in accordance with the constant current Icont generated by the error amplifier AMP and control transistor NM1, controls the on-current of the output transistor PM2 via the transistor PM1. Further, the gate drive circuit 1, under the current control, drives the switching element Q1 on with the constant current. Consequently, the time to charge the gate capacitance of the switching element Q1 is made constant despite temperature or supply voltage fluctuations. As a result, the turn-on time of the switching element Q1 is kept constant.

Also, FIG. 7 shows a gate drive circuit introduced in JP-A-2010-193431. The gate drive circuit 3 is configured in such a way as to control on/off of an output transistor 4, which is formed of a p-channel MOS-FET and drives the switching element Q1 on/off, using a pre-driver 7 of a complementary metal-oxide-semiconductor (CMOS) configuration formed of a p-channel MOS-FET 5 and n-channel MOS-FET 6. Further, the source voltage which is the operating reference voltage of the n-channel MOS-FET 6 in the pre-driver 7 is defined by a constant voltage source 8, thereby driving the switching element Q1 with a constant voltage Vg1.

SUMMARY

In the gate drive circuit 1 of FIG. 6, a control signal which drives the output transistor PM2 on/off is generated using the error amplifier AMP. Therefore, there is a delay that occurs in the control of the output transistor PM2 due to a delayed response of the error amplifier AMP. Also, in the gate drive circuit 1, to change the gate resistance for the switching element Q1, a plurality of the output transistors PM2 may be provided in parallel. In this case, it is necessary to provide a control circuit section including the transistor PM1, NM1, or the like, for each output transistor PM2. Hence, such a configuration leads to a larger scale.

In the gate drive circuit 3 of FIG. 7, it is possible to make the voltage Vg1, which drives the output transistor 4 on, constant. However, when temperature or supply voltage fluctuations are present, an on-current Im flowing through the n-channel metal-oxide-semiconductor field-effect transistor (MOS-FET) 6 in the pre-driver 7 changes. Then, the time to charge the gate capacitance of the output transistor 4 changes. As a result, the turn-on time of the output transistor 4 varies.

The present disclosure, however, provides a gate drive circuit of a configuration where the output current of an output transistor which drives a switching element on/off is kept constant regardless of temperature or supply voltage fluctuations, and the turn-on time of the output transistor can thereby be stabilized.

A gate drive circuit according to the present disclosure includes:

an output transistor may provide a constant current to the gate of a switching element and drive the switching element on;

a pre-driver of a complementary metal oxide semiconductor (CMOS) configuration, may include a p-channel MOS-FET and n-channel MOS-FET, may receive a gate control signal and drive the output transistor on/off;

a reference current source may control the gate voltage of a constant current transistor and provide a constant current flowing from the constant current transistor; and a buffer amplifier may apply the gate voltage of the constant current transistor as the operating reference voltage of the pre-driver.

It one implementation, the reference current source may include an error amplifier which may obtain a voltage difference between a voltage generated at a reference resistor by the current flowing from the constant current transistor and a preset reference voltage, and that the reference current source may provide a constant current from the constant current transistor by feedback controlling the gate voltage of the constant current transistor in response to the output of the error amplifier. Incidentally, the reference resistor may be a resistor in which its temperature dependent characteristics may be ignored.

Also, the output transistor and the constant current transistor may each be a MOS-FET. Further, the pre-driver, whose reference voltage may be set via the buffer amplifier, may cause a current to output from the output transistor, proportional to the current output from the constant current transistor, when the pre-driver receives the gate control signal and drives the output transistor on.

It is possible that when a plurality of the output transistors are connected in parallel, a plurality of the pre-drivers may be correspond to the respective output transistors. The plurality of pre-drivers may set a gate current, which drives the switching element on/off, by respectively receiving the gate control signals individually and driving the respective output transistors on/off.

In addition to the described configurations, it is also possible to include a capacitor which may store the gate voltage of the constant current transistor via a switch element, and applies the stored gate voltage to the buffer amplifier. In the described configuration, the switch element may cause the capacitor to store the gate voltage of the constant current transistor in response to the output transistor turning off due to the gate control signal being input into the pre-driver. Also, the reference current source may be driven on/off together with the switch element.

According to the gate drive circuit of the described configuration, the pre-driver can be driven on/off by the current proportional to the current defined by the reference current source. Moreover, the current defined by the reference current source can be kept constant regardless of temperature or supply voltage fluctuations. Consequently, it is possible to drive the output transistor with a constant current despite temperature or supply voltage fluctuations, and thus possible to keep the turn-on time of the output transistor always constant and stable.

As a result, according to the gate drive circuit according to the present disclosure, it is possible to stably drive the switching element without causing a response time delay due to temperature or supply voltage fluctuations. Moreover, as the configuration of the gate drive circuit is modest, the gate drive circuit is not prohibitive in size despite using a plurality of output transistors in parallel. Therefore, the gate drive circuit may apply to various kinds of switching elements in an intelligent power module (IPM) or the like.

DETAILED DESCRIPTION

Figure 1:
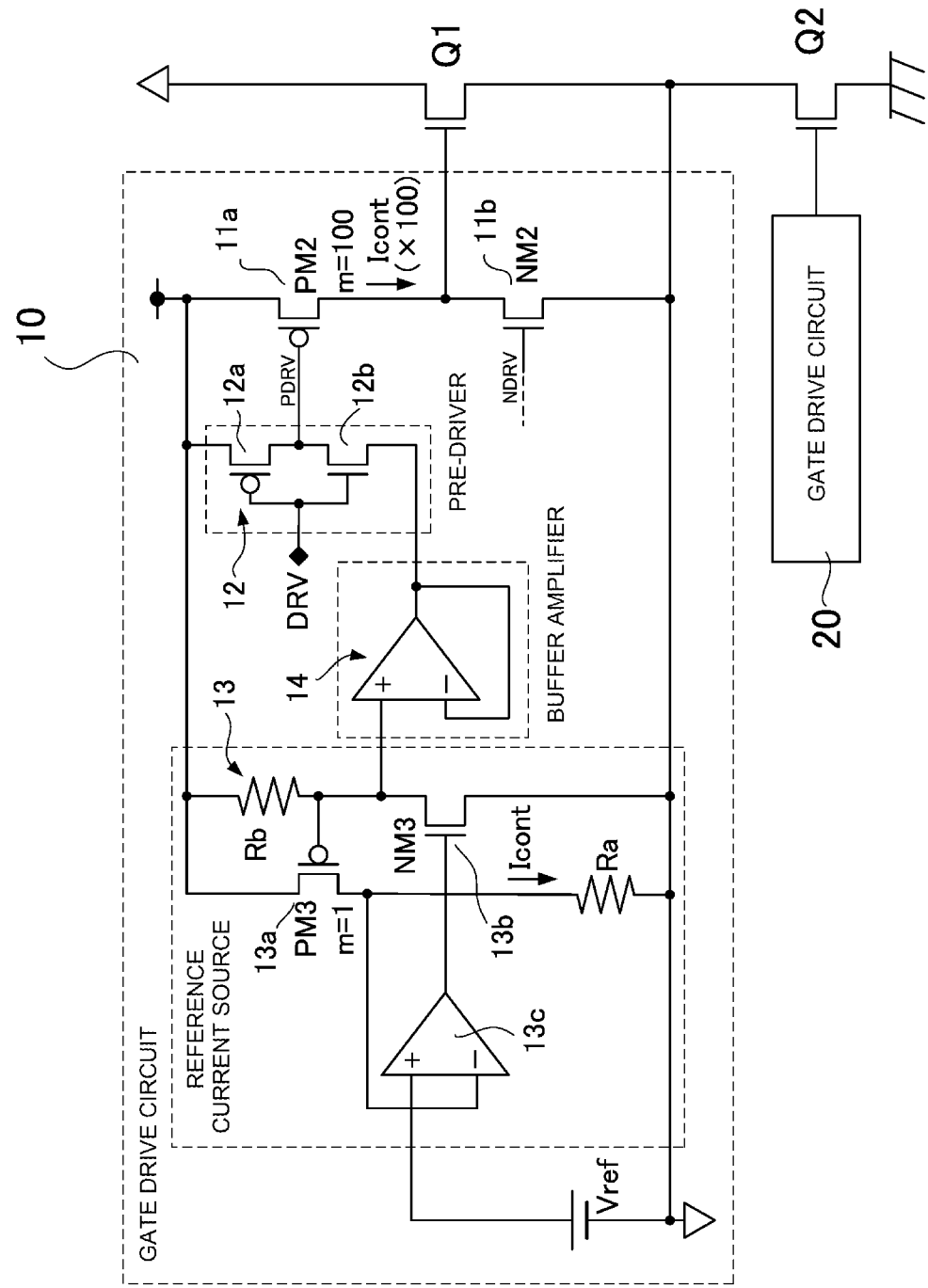
FIG. 1 is a main portion outline configuration diagram showing a basic configuration of a gate drive circuit according to the present disclosure.

Hereafter, a description will be given, referring to the drawings, of a gate drive circuit according to the present disclosure.

FIG. 1 is a main portion outline diagram showing a configuration of a gate drive circuit 10 according to the present disclosure, in which a turn-on control output transistor 11a is formed of a p-channel MOS-FET PM2, and a turn-off control output transistor 11b formed of an n-channel MOS-FET NM2. The output transistors 11a and 11b form a totem pole circuit by connecting the drains of the output transistors 11a and 11b. Further, the output transistors 11a and 11b control the gate voltage of switching element Q1 using the drain voltages of the output transistors 11a and 11b to drive the switching element Q1 on/off.

Figure 7:
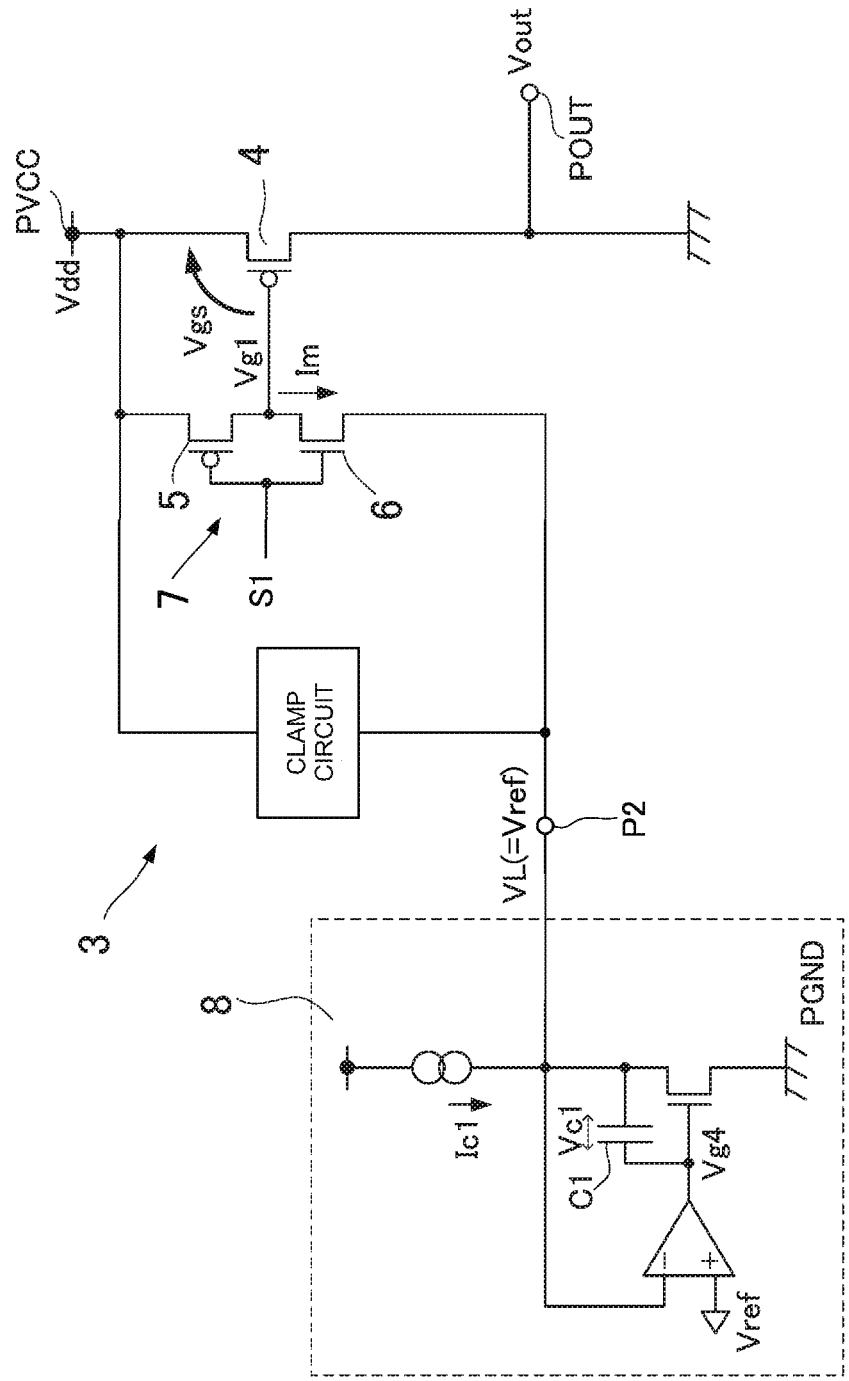
FIG. 7 is a diagram showing another example of the heretofore known gate drive circuit.

Also, the gate drive circuit 10 includes a pre-driver 12 having a CMOS configuration formed of a p-channel MOS-FET 12a and n-channel MOS-FET 12b. The pre-driver 12 assumes the role of driving the output transistor 11a on/off by being controlled on/off in response to a gate control signal DRV. The pre-driver 12 itself is the same as the previously described pre-driver 7 in the gate drive circuit 3 shown in FIG. 7.

Further, the gate drive circuit 10 includes a reference current source 13 including a constant current transistor 13a formed of a p-channel MOS-FET PM3, a voltage controlled transistor 13b formed of an n-channel MOS-FET NM3, and an error amplifier 13c. The reference current source 13 also includes a reference resistor Ra connected in series to the constant current transistor 13a, and a load resistor Rb connected in series to the voltage controlled transistor 13b. The resistance of the reference resistor Ra does not change due to a change in temperature. Thus, the temperature dependent characteristics of the resistor Ra can be ignored.

Further, the error amplifier 13c drives the voltage controlled transistor 13b in response to a voltage difference between a voltage, at resistor Ra in response to a current Icont flowing from the constant current transistor 13a, and a reference voltage Vref. The drain voltage of the voltage controlled transistor 13b is fed back as the gate voltage of the constant current transistor 13a, and the current Icont flowing through the constant current transistor 13a is thereby controlled to be made constant. Consequently, the gate voltage of the constant current transistor 13a exhibits a constant value, despite temperature or supply voltage fluctuations, by the feedback control via the voltage controlled transistor 13b.

The gate drive circuit 10 according to the present disclosure is configured such that the gate voltage of the constant current transistor 13a is applied, as the operating reference voltage of the pre-driver 12, via a buffer amplifier 14 acting as an impedance conversion circuit. Specifically, the gate voltage of the constant current transistor 13a is applied, as the source voltage of the n-channel MOS-FET 12b of the pre-driver 12, via the buffer amplifier 14.

Because the gate voltage of the constant current transistor 13a is then kept constant despite temperature or supply voltage fluctuations, as previously described, the source voltage which is the operating reference voltage of the n-channel MOS-FET 12b is also kept constant regardless of temperature or supply voltage fluctuations. That is, the source voltage of the n-channel MOS-FET 12b is controlled by the gate voltage of the constant current transistor 13a via the buffer amplifier 14. Hence, the pre-driver 12 is indirectly controlled in current mirror fashion by the reference current source 13 via the buffer amplifier 14. Consequently, a current proportional to the current Icont flows through the output transistor 11a, which operates to turn on/off, upon receiving the output of the pre-driver 12 at the gate of the output transistor 11a, when the output transistor 11a operates to turn on.

At this time, the output transistor 11a is driven on with a constant voltage by the pre-driver 12. Therefore, the time to charge the gate capacitance of the output transistor 11a is also always constant. Consequently, it is possible to stabilize the turn-on time of the output transistor 11a, and keep the turn-on time constant despite temperature or supply voltage fluctuations. Further, it is possible to stably drive the switching element Q1 on with a constant current despite temperature or supply voltage fluctuations.

Figure 2:
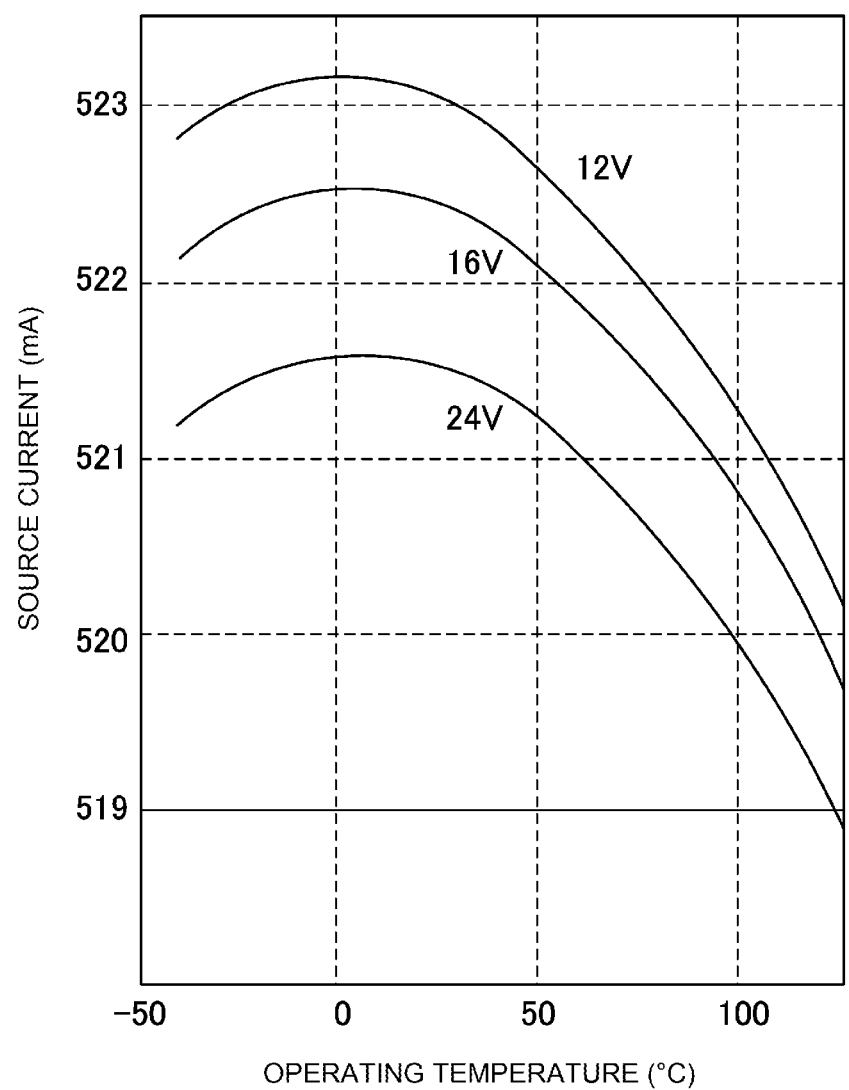
FIG. 2 is a diagram showing a change in a source current, which is an output current of an output transistor, with respect to a change in operating temperature.

FIG. 2 shows temperature-change characteristics of a source current which is the output current of the output transistor 11a in the gate drive circuit 10 configured as presently described. As shown in FIG. 2, when the supply voltage is 12V in a temperature range of [−50° C. to 125° C.], the maximum current value is 523.1 mA, and the minimum current value is 520.1 mA. Also, when the supply voltage is 16V in a temperature range of [−50° C. to 125° C.], the maximum current value is 522.5 mA, and the minimum current value is 519.7 mA. Further, when the supply voltage is 24V in a temperature range of [−50° C. to 125° C.], the maximum current value is 521.6 mA, and the minimum current value is 518.8 mA.

Despite the changes in the supply voltage in a range of 12V to 24V, the fluctuation range of the source current is kept to a maximum of 4.3 mA, and thus the fluctuation rate of the source current is less than 1%. That is, according to the gate drive circuit 10 as presently described, it is possible to supply a constant output current to drive the switching element Q1, and keep the output current stable despite temperature or supply voltage fluctuations.

Next, a description will be given of specific implementations of the present disclosure.

Figure 3:
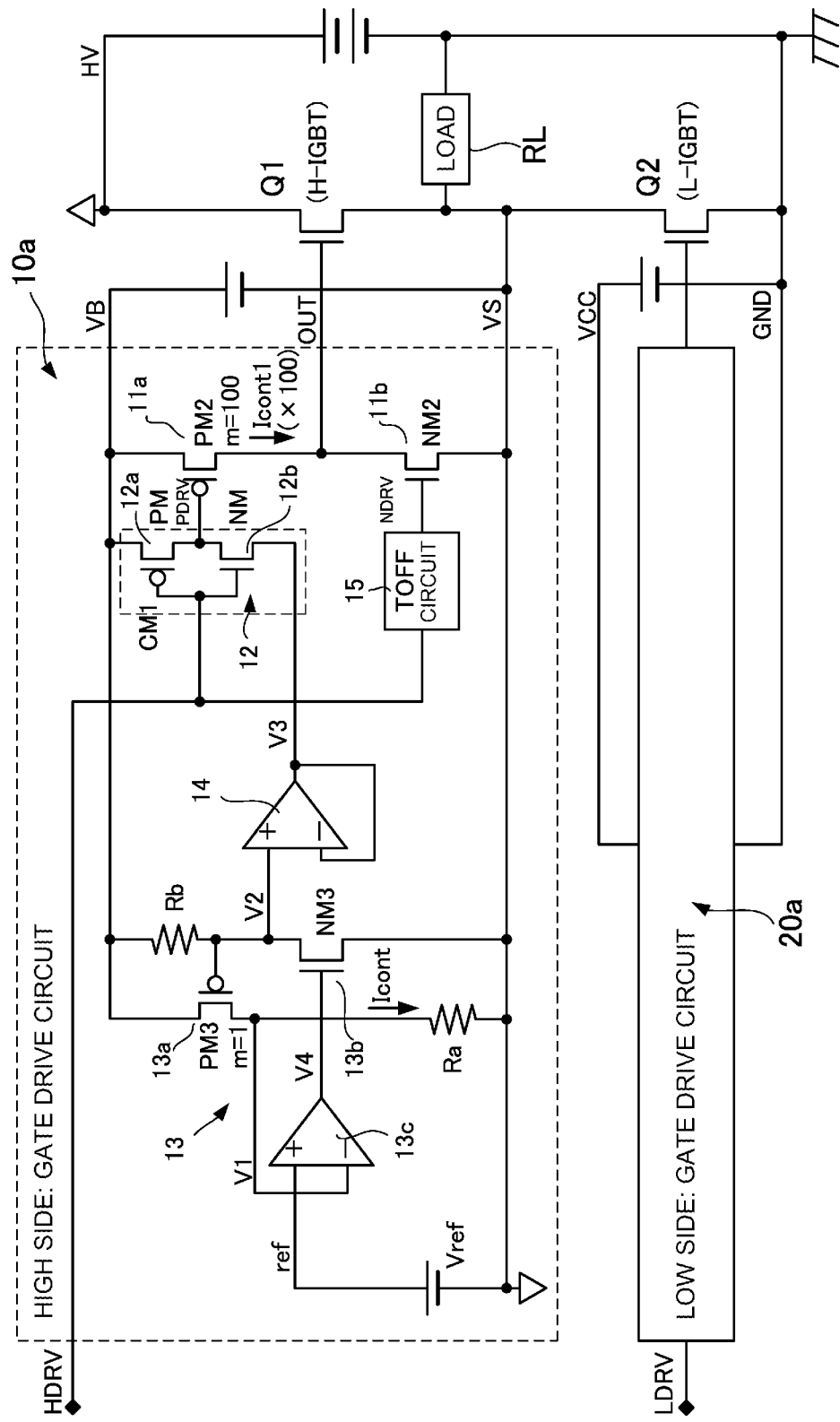
FIG. 3 is a diagram showing a configuration example of a gate drive circuit according to a first implementation of the present disclosure.

FIG. 3 shows a configuration example of a gate drive circuit 10a according to a first implementation. The gate drive circuit 10a has a drive circuit section of the same configuration as in the gate drive circuit 10 shown in FIG. 1, as a drive circuit section for the output transistor 11a. Also, the gate drive circuit 10a includes a turn-off circuit (abbreviated to a TOFF circuit) 15 as a drive circuit section for the output transistor 11b which is connected in totem pole fashion, in series, with the output transistor 11a. The turn-off circuit 15 assumes the role of inputting the gate control signal NDRV and driving the output transistor 11b on/off in a complementary relationship with the output transistor 11a.

Consequently, when the gate control signal PDRV is [L] level, the output transistor 11a operates to turn on by the gate potential being set to the operating reference voltage, and as opposed to this, the output transistor 11b operates to turn off. Further, a current Icont1 is supplied to the gate of the switching element Q1 via the output transistor 11a, and the switching element Q1 turns on. Also, when the gate control signal PDRV is [H] level, the output transistor 11a operates to turn off, while the output transistor 11b operates to turn on, and the switching element Q1 turns off.

Incidentally, the gate drive circuit 10a is used in driving on/off the high-side switching element Q1 of a half-bridge circuit configured by connecting two switching elements Q1 and Q2, each formed of an insulated-gate bipolar transistor (IGBT), in series. Also, the low-side switching element Q2 of the half-bridge circuit is driven on/off by a gate drive circuit 20a provided in parallel with the gate drive circuit 10a. The gate drive circuit 20a is configured in the same way as the gate drive circuit 10a, and thus a description thereof will be omitted.

The half-bridge circuit assumes the role of switching a direct current high voltage HV and supplying alternating current power to a load RL connected to an output terminal which is the midpoint of the half-bridge circuit. Herein, the high-side gate drive circuit 10a is configured in such a way as to operate upon receiving a predetermined supply voltage VB with a midpoint potential VS of the half-bridge circuit as a reference potential. Also, the low-side gate drive circuit 20a is configured in such a way as to operate upon receiving a predetermined supply voltage VCC with a ground potential GND as a reference potential. This configuration is the same as that of a power converter configured including a half-bridge circuit. Further, the gate drive circuits 10a and 20a operate by respectively inputting gate control signals HDRV and LDRV whose timing is controlled so that the switching elements Q1 and Q2 do not come into on-state at the same time.

According to the gate drive circuits 10a and 20a configured in this way, the switching elements Q1 and Q2 in the half-bridge circuit are driven on/off respectively in response to the gate control signals HDRV and LDRV. At this time, the respective output currents of the gate drive circuits 10a and 10b which respectively drive the switching elements Q1 and Q2 are made constant, as previously described. That is, as the source voltage which is the operating reference voltage of the n-channel MOS-FET 12b in the pre-driver 12 is defined by the gate voltage of the constant current transistor 13a, the source voltage is kept constant despite temperature or in the supply voltages fluctuations in VB and VCC.

Consequently, the pre-driver 12, which acts as a switch for the gate control signal DRV (HDRV, LDRV), drives the output transistor 11a on/off by operating to turn on/off with the source voltage of the n-channel MOS-FET 12b as a reference potential. As a result of this, the output transistor 11a is driven on upon receiving a constant gate voltage. Consequently, the time to charge the gate capacitance of the output transistor 11a is also constant, and thus the time to turn-on the output transistor 11a does not vary. Moreover, the source current of the output transistor 11a, which is the output current when the output transistor 11a is in on-operation, is also kept always constant.

Incidentally, it is supposed that channel lengths L of the constant current transistor 13a and output transistor 11a are equal, and the ratio of channel widths W of the transistors 13a and 11a is 1:m. In this case, a current m times (for example, 100 times) as large as the current Icont, which is made constant and flows through the constant current transistor 13a, flows through the output transistor 11a. Consequently, even though the constant current Icont defined in the reference current source 13 is, for example, 1 mA, it is possible to obtain an output current of [m×Icont], for example, an output current of 100 mA from the output transistor 11a. Therefore, it is possible to turn on the switching element Q1.

Figure 4:
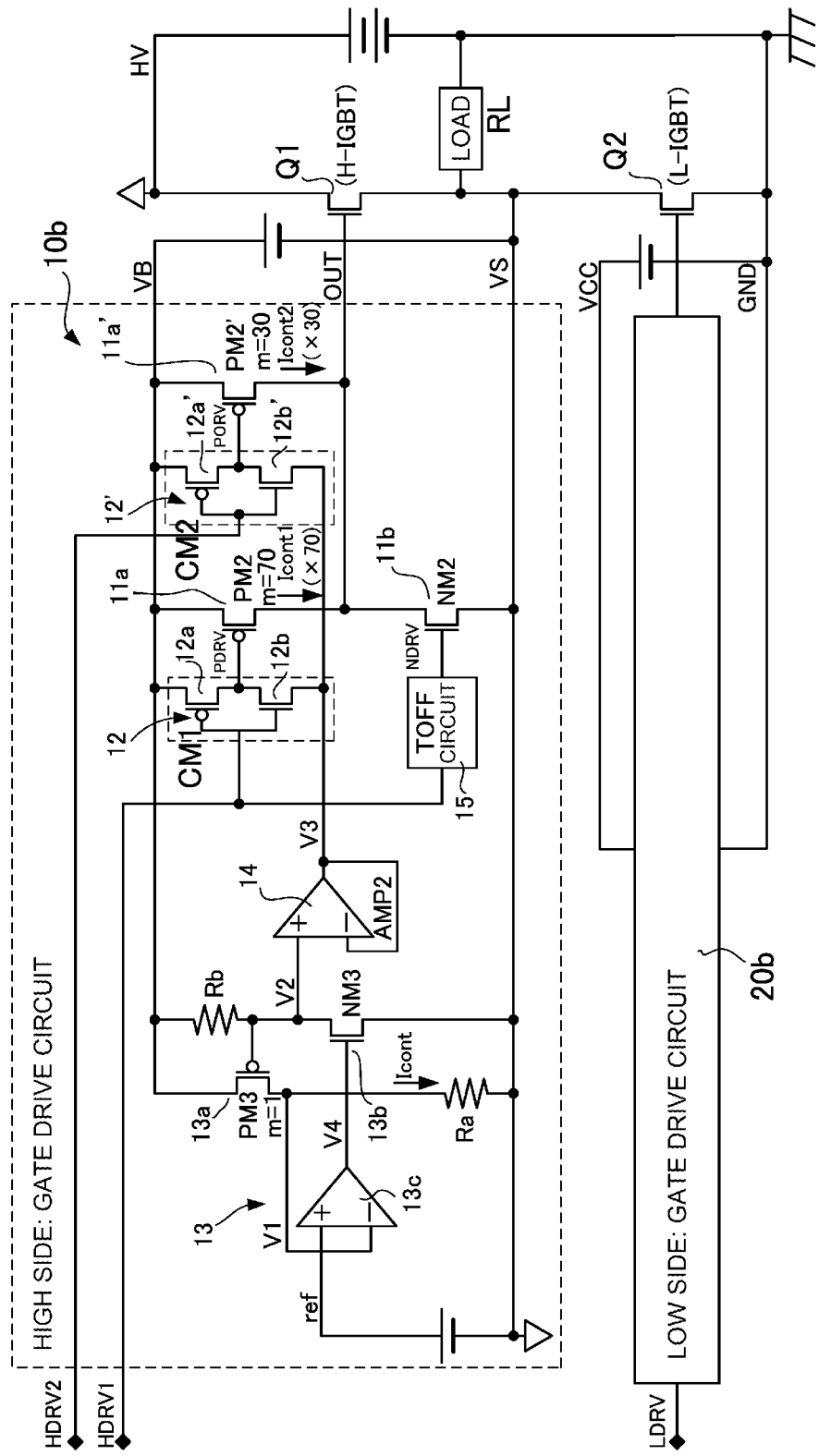
FIG. 4 is a diagram showing a configuration example of a gate drive circuit according to a second implementation of the present disclosure.

FIG. 4 shows a configuration example of a gate drive circuit 10b according to a second implementation. In the second implementation too, a low-side gate drive circuit 20b is configured in the same way as the high-side gate drive circuit 10b.

Herein, the gate drive circuit 10b is configured by providing two output transistors 11a and 11a', formed of p-channel MOS-FETs PM2 and PM2' respectively, in parallel so that it is possible to change and set the output current of the output transistor 11a by changing the gate resistance for the output transistor 11a. Herein, an example where the two output transistors 11a and 11a' are provided in parallel is shown, but it is also possible to provide three or more output transistors 11a in parallel.

In this case, two pre-drivers 12 and 12' are provided so as to correspond to the respective two output transistors 11a and 11a'. Also, the source voltages of n-channel MOS-FETs 12b and 12b' in the respective pre-drivers 12 and 12' are each defined by the gate voltage of the constant current transistor 13a via the buffer amplifier 14. Further, a configuration is adopted such that the pre-driver 12 is operated on/off by a main gate control signal HDRV1, while the pre-driver 12' is operated on/off by an auxiliary gate control signal HDRV2.

Figure 6:
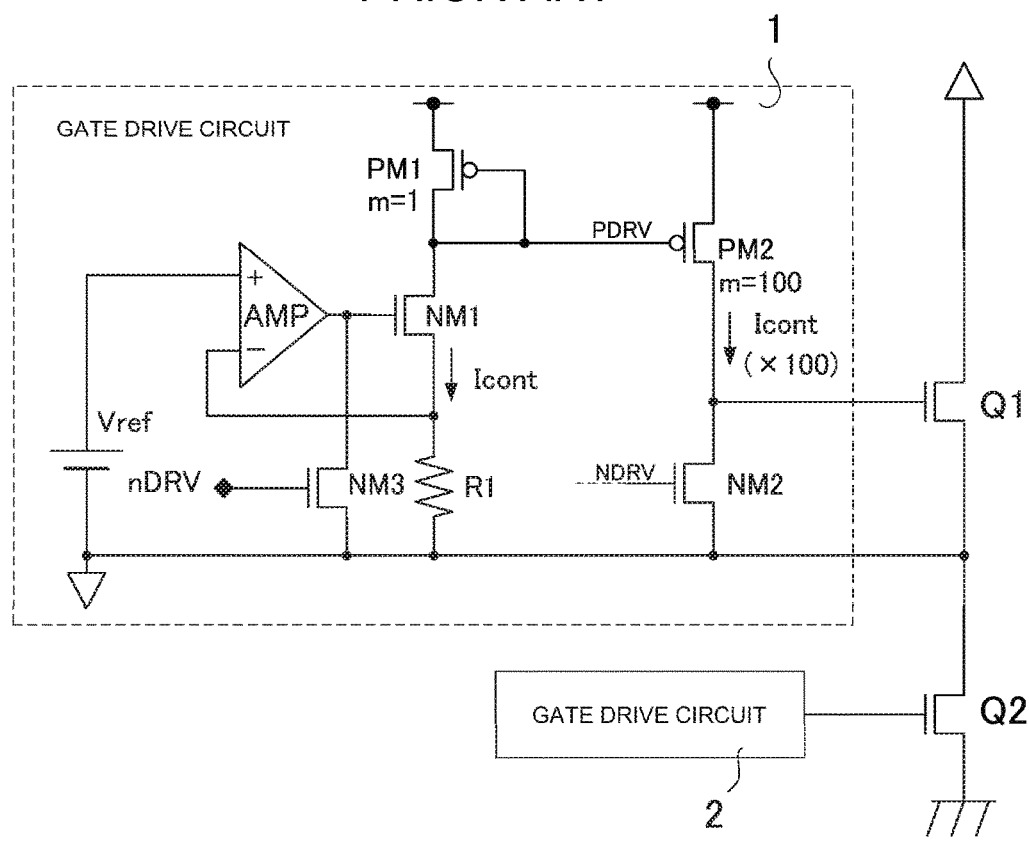
FIG. 6 is a diagram showing an example of a heretofore known gate drive circuit.

According to the gate drive circuit 10b configured in this way, the pre-drivers 12 and 12' only have to be provided so as to correspond to the respective two output transistors 11a and 11a' provided in parallel, and it is possible to produce the same effects as in the previously described first implementation. Moreover, it is possible to simply realize the pre-drivers 12 and 12' themselves as a circuit of a CMOS configuration formed of p-channel MOS-FETs 12a and 12a' and n-channel MOS-FETs 12b and 12b'. Consequently, it is possible to produce an effect such that the configuration of the gate drive circuit 10b is not of a large scale, as in the previously described case of the gate drive circuit shown in FIG. 6.

Figure 5:
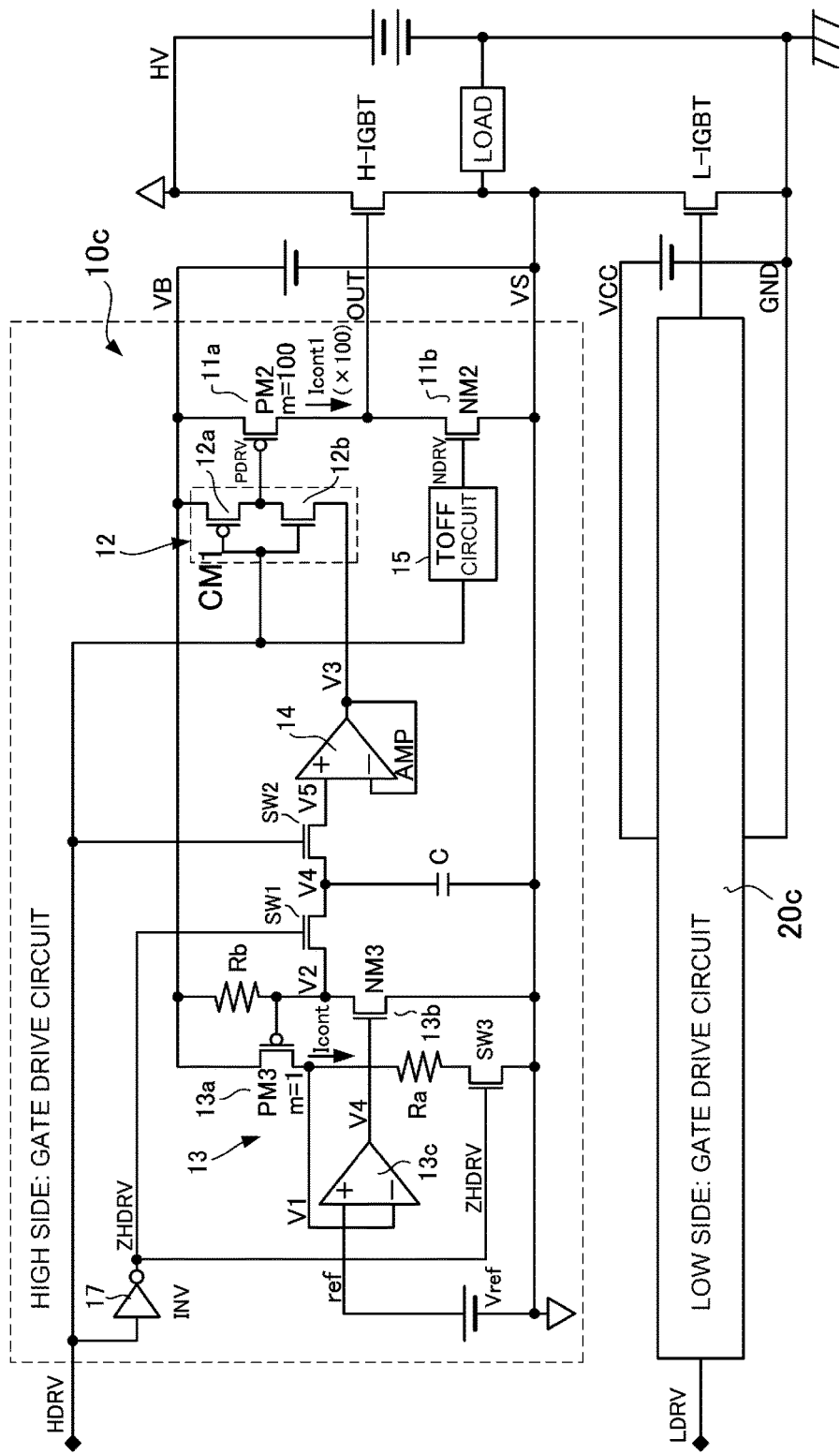
FIG. 5 is a diagram showing a configuration example of a gate drive circuit according to a third implementation of the present disclosure.

In the meantime, by configuring a gate drive circuit in the following way, it is also possible to save power in the gate drive circuit. FIG. 5 shows a configuration example of a gate drive circuit 10c according to a third implementation which can save power. In the third implementation too, a low-side gate drive circuit 20c is configured in the same way as the high-side gate drive circuit 10c.

The gate drive circuit 10c is configured such that a capacitor C is provided between the reference current source 13 and the buffer amplifier 14, via switch elements SW1 and SW2, and that a switch element SW3 is provided connected to the reference resistor Ra of the reference current source 13. The switch elements SW1, SW2, and SW3 are each formed of, for example, an n-channel MOS-FET. Further, the gate drive circuit 10c is configured in such a way that the switch element SW2 is driven on/off by the gate control signal HDRV, and that the switch elements SW1 and SW3 are driven on/off by a signal ZHDRV wherein the gate control signal HDRV is logically inverted via a NOT circuit 17.

Specifically, the capacitor C connected to the gate of the constant current transistor 13a via the first switch element SW1, is provided so as to be charged with the gate voltage of the constant current transistor 13a via the first switch element SW1 and hold the gate voltage. Further, a configuration is adopted such that the voltage with which the capacitor C is charged and held by the capacitor C is input into the buffer amplifier 14 via the second switch element SW2. Also, the third switch element SW3 assumes the role of causing the current Icont to flow through the constant current transistor 13a by operating to turn on at the same time as the first switch element SW1.

Thus, in the gate drive circuits 10c and 20c, the reference current source 13 operates only when the gate control signal HDRV is [L] level. Further, at this time, the gate voltage of the constant current transistor 13a is held by the capacitor C, via the switch element SW1, in response to the current Icont flowing through the constant current transistor 13a. Further, when the gate control signal HDRV is inverted to [H] level, the operation of the reference current source 13 stops, and the voltage held by the capacitor C is given to the buffer amplifier 14 via the switch element SW2.

As a result, when the gate control signal HDRV changes to [H] level and the n-channel MOS-FET 12b of the pre-driver 12 operates to turn on, the source potential which is the operating reference voltage of the n-channel MOS-FET 12b is defined by the voltage held by the capacitor C and thus the gate voltage of the constant current transistor 13a. Consequently, in the gate drive circuits 10c and 20c of the heretofore described configuration too, it is possible to produce the same effects as those of each previous implementation. Moreover, according to the gate drive circuits 10c and 20c, as the operation of generation of the constant current Icont by the reference current source 13 stops in response to the gate control signal HDRV, it is possible to reduce the power consumption of the reference current source 13 to substantially half compared with in the reference current sources 13 of the previously described gate drive circuits 10a, 10b, 20a, and 20b. Therefore, the gate drive circuits 10c and 20c have the power-saving effect compared with the previously described implementations.

The present disclosure is not limited to each described implementation. For example, in the third implementation, in a case where the input impedance of the buffer amplifier 14 is high, and self-discharge characteristics of the capacitor C can be ignored, the voltage held by the capacitor C can be stored over a period in which the gate control signal HDRV is inverted to [H] level. Consequently, in this case, it is possible to omit the switch element SW2.

Also, in each previously described gate drive circuit 10 and 20, the present disclosure can be applied to the case of inserting a resistor between the output transistor 11a and the gate of the switching element Q1 and adjusting the turn-on time of the switching element Q1 with the resistor. Furthermore, the size of the constant current Icont generated by the reference current source 13 and the ratio of the currents flowing through the constant current transistor 13a and output transistor 11a may also be set in response to the specifications of the switching element Q1 which the gate drive circuit 10 is to drive. Also, the present disclosure can be similarly applied to the case of using a high voltage MOS-FET as the switching element Q1. In addition, the present disclosure can be variously modified and implemented without departing from the scope thereof.

What is claimed is:

1. A gate drive circuit for driving a switching element having a gate, the gate drive circuit comprising:
    an output transistor that provides a constant current to the gate of the switching element to drive the switching element on;
    a pre-driver having a complementary metal-oxide-semiconductor (CMOS) configuration including
        a p-channel metal-oxide-semiconductor field-effect-transistor (MOS-FET), and
        an n-channel MOS-FET,
    the pre-driver receiving a gate control signal to drive the output transistor on/off;

a reference current source including
a constant current transistor having a gate, and
an error amplifier connected to the constant current transistor,
the reference current source being configured to provide a constant current from the constant current transistor by feedback-controlling a gate voltage of the constant current transistor in response to an output of the error amplifier; and
a buffer amplifier that applies the gate voltage of the constant current transistor as a reference voltage of the pre-driver.

2. The gate drive circuit according to claim 1, wherein
the reference current source further includes a reference resistor, and
the error amplifier obtains a voltage difference between
a voltage generated at the reference resistor by the constant current from the constant current transistor, and
a preset reference voltage,
to thereby generate the output.

3. The gate drive circuit according to claim 2, wherein the reference resistor has a resistance that remains substantially constant in a temperature range of −50° C. to 125° C.

4. The gate drive circuit according to claim 1, wherein
the output transistor is a MOS-FET, and
the constant current transistor is a MOS-FET.

5. The gate drive circuit according to claim 1, wherein
the pre-driver causes a current proportional to the constant current from the constant current transistor to be output from the output transistor in response to the gate control signal.

6. The gate drive circuit according to claim 1, further comprising:
a plurality of the output transistors connected in parallel, and
a plurality of the pre-drivers each corresponding to a respective one of the output transistors.

7. The gate drive circuit according to claim 6, wherein
the gate control signal is input to each of the pre-drivers individually, and
the pre-drivers drive the respective output transistors on/off.

8. The gate drive circuit according to claim 1, further comprising:
a capacitor configured to
store the gate voltage of the constant current transistor via a switch element, and
apply the stored gate voltage to the buffer amplifier.

9. The gate drive circuit according to claim 8, wherein
the switch element causes the capacitor to store the gate voltage of the constant current transistor when the gate control signal causes the output transistor to be driven into an off-state.

10. The gate drive circuit according to claim 8, wherein
the reference current source and the switch element are coupled so as to be driven on/off together.

11. The gate drive circuit according to claim 1, wherein
the buffer amplifier applies the gate voltage of the constant current transistor to a source of the n-channel MOS-FET as the reference voltage of the pre-driver.

12. The gate drive circuit according to claim 2, wherein
the reference current source further includes:
a voltage-controlled transistor having a gate terminal, and receiving the output of the error amplifier at the gate terminal to drive the voltage-controlled transistor on/off.

13. The gate drive circuit according to claim 1, wherein
the p-channel MOS-FET is connected in series with the n-channel MOS-FET by their respective drain terminals.

14. The gate drive circuit according to claim 13, wherein
the output transistor includes a gate terminal, and
the gate terminal of the output transistor is connected to the drain terminals of the p-channel MOS-FET and n-channel MOS-FET.

15. A gate drive circuit for driving a switching element having a gate, comprising:
an output transistor configured to provide a constant current to the gate of the switching element to drive the switching element on/off;
a reference current source including
a constant current transistor having a gate, and
an error amplifier connected to the constant current transistor,
the reference current source being configured to
generate a constant current from the constant current transistor by controlling a gate voltage of the constant current transistor in response to an output of the error amplifier, and
provide the gate voltage of the constant current transistor as a reference voltage; and
a pre-driver having a complementary metal-oxide-semiconductor (CMOS) configuration being adapted to
receive the reference voltage from the reference current source, and
receive a gate control signal to drive the output transistor on/off.

16. A gate drive circuit for driving a switching element having a gate, comprising:
an output transistor configured to provide a constant current to the gate of the switching element to drive the switching element on/off;
a reference current source including
a constant current transistor having a gate, and
an error amplifier connected to the constant current transistor,
the reference current source being configured to
generate a constant current from the constant current transistor by controlling a gate voltage of the constant current transistor in response to an output of the error amplifier, and
provide the gate voltage of the constant current transistor as a reference voltage; and
a pre-driver having a complementary metal-oxide-semiconductor (CMOS) configuration being adapted to
receive the reference voltage from the reference current source,
receive a gate control signal to drive the output transistor on/off, and
cause a current proportional to the constant current from the constant current transistor to be output from the output transistor in response to receiving the gate control signal and the reference voltage.

* * * * *